United States Patent
Chou et al.

(10) Patent No.: US 9,337,375 B2
(45) Date of Patent: May 10, 2016

(54) SEED USED FOR CRYSTALLINE SILICON INGOT CASTING

(71) Applicant: Sino-American Silicon Products Inc., Hsinchu (TW)

(72) Inventors: Hung-Sheng Chou, Hsinchu (TW); Yu-Tsung Chiang, Hsinchu (TW); Yu-Min Yang, Hsinchu (TW); Ming-Kung Hsiao, Hsinchu (TW); Wen-Huai Yu, Hsinchu (TW); Sung-Lin Hsu, Hsinchu (TW); I-Ching Li, Hsinchu (TW); Chung-Wen Lan, Hsinchu (TW); Wen-Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 206 days.

(21) Appl. No.: 14/139,641

(22) Filed: Dec. 23, 2013

(65) Prior Publication Data

US 2014/0186631 A1    Jul. 3, 2014

(30) Foreign Application Priority Data

Dec. 28, 2012  (TW) .............................. 101150738 A

(51) Int. Cl.
 *H01L 31/18* (2006.01)
(52) U.S. Cl.
 CPC ........... *H01L 31/1804* (2013.01); *Y02E 10/547* (2013.01); *Y02P 70/521* (2015.11); *Y10T 428/2991* (2015.01); *Y10T 428/2993* (2015.01)

(58) Field of Classification Search
None
See application file for complete search history.

(56) References Cited

U.S. PATENT DOCUMENTS 5,525,540 A * 6/1996 Zenke ............... H01L 21/28525
117/89

FOREIGN PATENT DOCUMENTS

JP    2005057155 A  *  3/2005
JP    2005272240 A  *  10/2005

OTHER PUBLICATIONS

Machine Translation JP 2005-057155 (2005).*
Machine Translation JP 2005-272240 (2005).*

* cited by examiner

*Primary Examiner* — Alexandre Ferre
(74) *Attorney, Agent, or Firm* — Christensen Fonder P.A.

(57) ABSTRACT

The invention discloses a seed used for crystalline silicon ingot casting. A seed according to a preferred embodiment of the invention includes a crystal and an impurity diffusion-resistant layer. The crystal is constituted by at least one grain. The impurity diffusion-resistant layer is formed to overlay an outer surface of the crystal. A crystalline silicon ingot fabricated by use of the seed of the invention has significantly reduced red zone and yellow zone.

2 Claims, 3 Drawing Sheets

SEED USED FOR CRYSTALLINE SILICON INGOT CASTING

CROSS-REFERENCE TO RELATED APPLICATION

This utility application claims priority to Taiwan Application Serial Number 101150738, filed Dec. 28, 2012, which is incorporated herein by reference.

BACKGROUND OF THE INVENTION

1. Field of the Invention

The invention relates to a seed used for crystalline silicon ingot casting, and particularly to a seed capable of reducing red zone and yellow zone of a crystalline silicon ingot fabricated by such seed.

2. Description of the Prior Art

Most of the photovoltaic cells produce a photovoltaic effect when absorbing sunlight. Currently, the photovoltaic cell is made of a silicon-based material, since for the most parts; silicon is the second most abundant and accessible element in the world. Also, silicon is cost-effective, nontoxic, and chemically stable, and becomes broadly used in semiconductor applications.

There are three forms of crystalline silicon for fabricating silicon-based photovoltaic cells, i.e., mono-crystalline silicon, multi-crystalline or polycrystalline silicon, and amorphous silicon. Multi-crystalline or polycrystalline silicon is much less expensive than mono-crystalline silicon when produced by Czochralski (CZ) method or float zone (FZ) method, so it is usually used as a raw material of the photovoltaic cell due to the economic concern.

Conventionally, multi-crystalline or polycrystalline silicon for photovoltaic cells is fabricated by a common casting process. That is, it is prior art to produce multi-crystalline or polycrystalline silicon for photovoltaic cells by a casting process. In brief, the multi-crystalline or polycrystalline silicon photovoltaic cell is fabricated by melting high purity silicon in a mold like quartz crucible, then cooling the melted silicon in a controlled solidification to form a multi-crystalline or polycrystalline silicon ingot. The multi-crystalline or polycrystalline silicon ingot is generally cut into bricks having a cross-section that is the same as or close to the size of the wafer to be used for manufacturing a photovoltaic cell, and the bricks are sawed or otherwise cut into such wafers. The ploy-Si produced in such manner is an agglomeration of crystal grains where, within the wafers made therefrom, the orientation of the grains relative to one another is effectively random.

The random orientation of grains, in either conventional multi-crystalline or poly-crystalline silicon, makes it difficult to texture the surface of a resulting wafer. Texturing is used to improve efficiency of a photovoltaic cell, by reducing light reflection and improving light energy absorption through the surface a cell. Additionally, "kinks" that form in the boundaries between the grains of conventional multi-crystalline or poly-crystalline silicon tend to nucleate structural defects in the form of clusters or lines of dislocations. These dislocations, and the impurities they tend to attract, are believed to cause a fast recombination of electrical charge carriers in a functioning photovoltaic cell made from conventional multi-crystalline or poly-crystalline silicon. This can cause a decrease in the efficiency of the cell. Photovoltaic cells made from such multi-crystalline or poly-crystalline silicon generally have lower efficiency compared to equivalent photovoltaic cells made from monocrystalline silicon, even considering the radial distribution of defects present in monocrystalline silicon produced by known techniques. However, because of the relative simplicity and lower costs for manufacturing conventional multi-crystalline or poly-crystalline silicon, as well as effective defect passivation in cell processing, multi-crystalline or poly-crystalline silicon is a more widely used form of silicon for manufacturing photovoltaic cells.

Currently, it has been developed that crystalline silicon ingot is fabricated using a mono-crystalline silicon seed layer and based on directional solidification. In this way, a high quality ingot of mono-crystalline silicon and/or bi-crystal silicon block or mono-like crystal silicon block may be obtained, in which the lifetime of the minority carriers is maximized in the resultant wafer employed for fabricating a high-performance photovoltaic cell. As used herein, the term "mono-crystalline silicon" refers to a body of single crystal silicon, having one consistent crystal orientation throughout. The term "bi-crystal silicon" refers to a body of silicon, having one consistent crystal orientation throughout for greater than or equal to 50% by volume of the body, and another consistent crystal orientation for the remainder of the volume of the body. For example, such bi-crystal silicon may include a body of single crystal silicon having one crystal orientation next to another body of single crystal silicon having a different crystal orientation making up the balance of the volume of crystalline silicon. The term "mono-like crystal silicon" refers to a body of silicon, having one consistent crystal orientation throughout for greater than 75% by volume of the body. Additionally, conventional multi-crystalline silicon refers to crystalline silicon having cm-scale grain size distribution, with multiple randomly oriented crystals located within a body of silicon. The term "poly-crystalline silicon" refers to crystalline silicon with micron order grain size and multiple grain orientations located within a given body of silicon. For example, the grains are typically an average of about submicron to sub-millimeter in size (e.g., individual grains may not be visible to the naked eye), and grain orientation distributed randomly throughout.

It has also been developed that crystalline silicon ingot is fabricated using a nucleation promotion layer constituted by granulars of mono-crystalline or poly-crystalline silicon to assist in nucleation of silicon grains and based on direction solidification. The resultant crystalline silicon ingot has small-sizes silicon grains at the bottom thereof and low density of bulk defects, and can be used for fabricating a high-performance photovoltaic cell.

The region in crystalline silicon ingot generally fabricated using crucible and not meeting requirement represents as "red zone". The photovoltaic cell made from the red zone of general crystalline silicon ingot has low minority carrier lifetime. Red zone in the minority carrier lifetime mapping, obtained by a measurement way such as a microwave photoconductive decay (μ-PCD) way, shows red image. The causes of red zone include: a. the region containing impurities in solid state diffusion from crucible; b. the region of non-perfect crystal structure near the crucible; c. the boron-rich or oxygen-rich region; and d. the crystalline seeds and nucleation layer containing metal in liquid state diffusion from the silicon melt containing metal. In general, the region containing impurities, especially metal impurities, in solid state diffusion from crucible is the primary cause of red zone. The photoelectric conversion efficiency of photovoltaic cell made from the red zone of crystalline silicon ingot severely decays and decreases.

Yellow image in the minority carrier lifetime mapping, obtained by a measurement way such as a μ-PCD way, represents as "yellow zone" which is also region polluted by impurities. The causes of yellow zone is that metal impurities in the crystalline seeds polluted by silicon melt diffuse back into the bottom of crystalline silicon ingot during initial seeding of the crystalline silicon ingot, where diffusion paths of metal impurities include grain boundary diffusion and solid state diffusion. Thus, some portion of yellow zone shows filamentous pattern. Yellow zone is less available region of the crystalline silicon ingot, but the photoelectric conversion efficiency of photovoltaic cell made from the yellow zone of crystalline silicon ingot is lower.

However, red zone of current crystalline silicon ingots, fabricated using a layer of single crystal seeds or a nucleation promotion layer of mono-crystalline or poly-crystalline silicon granulars disposed at the bottom of crucible, is larger than or even twice as much as that of crystalline silicon ingots fabricated using no above layers. Yellow zone of the crystalline silicon ingots fabricated using above layers is also lager than that of the crystalline silicon ingots fabricated using no above layers. Studying its causes, during fabrication of the crystalline silicon ingot, impurities primarily consisting of metal impurities (e.g., Fe, Al, etc.) in the crucible are dissolved in the silicon melt, and then diffuse into single crystal seeds or mono-crystalline or poly-crystalline silicon granulars. As silicon grains from the silicon melt nucleate and grow at the single crystal seeds or the mono-crystalline or poly-crystalline silicon granulars, the impurities in the single crystal seeds or the mono-crystalline or poly-crystalline silicon granulars will diffuse back into solidified silicon crystals.

SUMMARY OF THE INVENTION

Accordingly, one scope of the invention is to provide a seed capable of reducing red zone and yellow zone of a crystalline silicon ingot fabricated by such seed.

A seed according a preferred embodiment of the invention is used for crystalline silicon ingot casting. The seed of the invention includes a crystal and an impurity diffusion-resistant layer. The crystal is constituted by at least one grain. The impurity diffusion-resistant layer is formed to overlay an outer surface of the crystal.

In one embodiment, the at least one grain can be formed of Si, SiC, $SiO_2$, SiN, graphite or other material having a melting point higher than 1400° C. and capable of facilitating nucleation.

In one embodiment, the impurity diffusion-resistant layer can be formed of BaO, Tetraethyl orthosilicate (TEOS), silicon powders, $BaCO_3$/TEOS mixture, $BaCO_3$/$SiO_2$ mixture, SiN/TEOS mixture, SiN/$SiO_2$ mixture, BaO/SiN mixture, metal salt oxide/SiN mixture, metal salt oxide/$SiO_2$ mixture, metal salt oxide/TEOS mixture, BaO/$SiO_2$ mixture, BaO/TEOS mixture, SiC, SiO2, graphite, MN, BN, SiN, GaN, AlP, GaP, $Al_2O_3$ and metal fluorides (e.g., GaF, etc.) or other material capable of effectively inhibiting diffusion of impurities in silicon melt into the crystal and easily overlaying the outer surface of the crystal. In practical application, the metal element of the metal salt oxide can be Be, Mg, Sr, Ca, Ba, etc.

Further, the seed of the invention also includes a hetero-nucleation promoting layer. The hetero-nucleation promoting layer is formed to overlay the impurity diffusion-resistant layer, and is for assisting in hetero-nucleation of silicon grains.

In one embodiment, the hetero-nucleation promoting layer can be formed of SiN or BN. Distinguishable from the prior art, the seed of the invention can effectively resist impurities in silicon melt in diffusing back into solidified silicon crystal.

Thereby, the seed of the invention is capable of reducing red zone and yellow zone of a crystalline silicon ingot fabricated by such seed The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
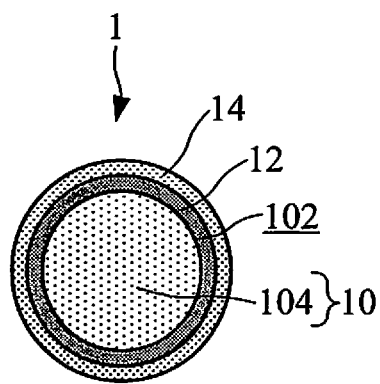
FIG. 1A is a sectional view of a seed according to a preferred embodiment of the invention.

Referring to FIGS. 1A, 1B, 2A, 2B, 3A and 3B, these drawings schematically show a seed 1 of the preferred embodiment and modifications of the invention via sectional views. The seed of the invention is used for crystalline silicon ingot casting.

As shown in FIGS. 1A, 1B, 2A, 2B, 3A and 3B, the seed 1 of the invention includes a crystal 10 and an impurity diffusion-resistant layer 12. The crystal 10 is constituted by at least one grain 104. That is to say, the seed 1 of the invention can inherently be a seed of single grain 104, such as these cases shown in FIG. 1A, FIG. 2A and FIG. 3A. The seed 1 of the invention can inherently also be a seed of a plurality of grains 104, such as these cases shown in FIG. 1B, FIG. 2B and FIG. 3B. The impurity diffusion-resistant layer 12 is formed to overlay an outer surface 102 of the crystal 10.

In one embodiment, the at least one grain 104 can be formed of Si, SiC, $SiO_2$, SiN, graphite or other material having a melting point higher than 1400° C. and capable of facilitating nucleation. In practical application, the seeds 1 of different materials can be mixed to use.

Figure 1B:
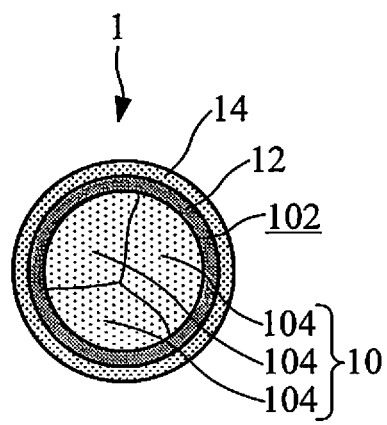
FIG. 1B is a sectional view of a modification of the seed according to the preferred embodiment of the invention.
Figure 2A:
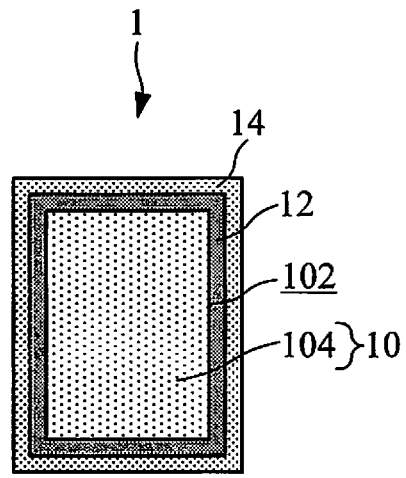
FIG. 2A is a sectional view of another modification of the seed according to the preferred embodiment of the invention.
Figure 2B:
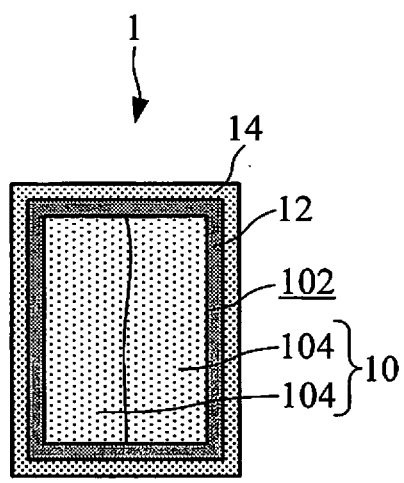
FIG. 2B is a sectional view of another modification of the seed according to the preferred embodiment of the invention.
Figure 3A:
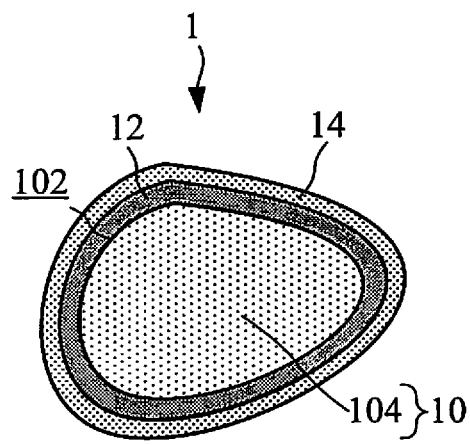
FIG. 3A is a sectional view of another modification of the seed according to the preferred embodiment of the invention.
Figure 3B:
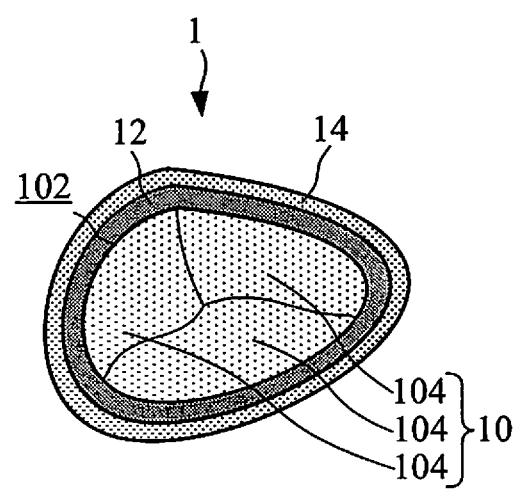
FIG. 3B is a sectional view of another modification of the seed according to the preferred embodiment of the invention.

In practical application, the seed 1 of the invention can have large size (i.e., centimeter scale) cubic shape, and be constituted by single grain 104 such as the seed 1 as shown in FIG. 2A. The seed 1 of the invention can have small size (i.e., millimeter scale) spherical shape such as the seeds 1 as shown in FIGS. 1A and 1B, or millimeter scale irregular shape (i.e., so-called granular) such as the seeds 1 as shown in FIGS. 3A and 3B, and be constituted by single grain 104 or a plurality of grains 104.

In one embodiment, the impurity diffusion-resistant layer 12 overlaying the outer surface 102 of the crystal 10 can have rough surface which provides nucleation sites for silicon grins during fabrication of the crystalline silicon ingot. In addition, the impurity diffusion-resistant layer 12 overlaying the outer surface 102 of the crystal 10 can also provide nucleation sites at the surface thereof for during fabrication of the crystalline silicon ingot by its properties of undercooling and high melting point.

In one embodiment, the impurity diffusion-resistant layer 12 can be formed of BaO, Tetraethyl orthosilicate (TEOS), silicon powders, $BaCO_3$/TEOS mixture, $BaCO_3$/$SiO_2$ mixture, SiN/TEOS mixture, SiN/$SiO_2$ mixture, BaO/SiN mixture, metal salt oxide/SiN mixture, metal salt oxide/SiO$_2$ mixture, metal salt oxide/TEOS mixture, BaO/SiO$_2$ mixture, BaO/TEOS mixture, SiC, SiO2, graphite, AlN, BN, SiN, GaN, AlP, GaP, Al$_2$O$_3$ and metal fluorides (e.g., GaF, etc.) or other material capable of effectively inhibiting diffusion of impurities in silicon melt into the crystal 10 and easily overlaying the outer surface 102 of the crystal 10. The impurities have poor diffusion ability as encountering the impurity diffusion-resistant layer 12 of above materials other than silicon powders on their diffusion path. Therefore, the impurity diffusion-resistant layer 12 can effectively resist the impurities in the silicon melt in diffusing into the crystal 10. Silicon powders can react with Fe into FeSi compound or react with Al into AlSi compound to resist Fe and Al impurities into the crystal 10. Above materials also have effect of assisting silicon grains in hetero-nucleation.

In general, when a crystalline silicon ingot casting is prepared, a release layer is coated on the inner wall of a crucible. During the casting of the crystalline silicon ingot, the release layer more or less resists the impurities in diffusing into the silicon melt, thus somewhat lowers the impurity concentration in the crystalline silicon ingot. However, using the seed 1 of the invention, the impurity diffusion-resistant layer 12 can effectively resist the in impurities in the silicon melt in diffusing into the crystal 10 to significantly lower the impurity concentration in the crystalline silicon ingot.

In practical application, the impurity diffusion-resistant layer 12 can be formed to overlay the outer surface 102 of the crystal 10 by spraying way, brushing way, depositing way, evaporating way, etc. Taking overlaying of BaO as an example, the outer surface 102 of the crystal 10 is first sprayed with Ba(OH)$_2$-8H$_2$O, and then the crystal 10 is heated in a furnace with CO$_2$ atmosphere or supplying with CO$_2$ from outside, where Ba(OH)$_2$-8H$_2$O will react with CO$_2$ into BaCO$_3$. BaCO$_3$ is discomposed into BaO as being heated at high temperature and in CO$_2$ atmosphere. Otherwise, the outer surface 102 of the crystal 10 is treated to form the impurity diffusion-resistant layer 12 by high temperature oxidization treatment, high temperature nitridation or high temperature carbonization treatment. Besides, the impurity diffusion-resistant layer 12 can be formed to overlay the outer surface 102 of the crystal 10 by atmospheric pressure chemical vapor deposition (APCVD), low-pressure chemical vapor deposition (LPCVD), atomic layer deposition (ALD), etc.

In practical application, the metal element of the metal salt oxide can be Be, Mg, Sr, Ca, Ba, etc.

During fabrication of the crystalline silicon ingot, above impurity diffusion-resistant layers 12 have effect of protecting the crystal 10 from early melting. Thereby, fabrication time of the crystalline silicon ingot can be shortened, and the thickness of the layer constituted by the seed 1 can be reduced.

Further, as shown in FIGS. 1A, 1B, 2A, 2B, 3A and 3B, the seed 1 of the invention also includes a hetero-nucleation promoting layer 14. The hetero-nucleation promoting layer 14 is formed to overlay the impurity diffusion-resistant layer 12, and functions in hetero-nucleation of silicon grains.

In one embodiment, hetero-nucleation promoting layer 14 is formed of SiN or BN. In practical application, it is preferred to spray SiN powders on the impurity diffusion-resistant layer 12 to form the hetero-nucleation promoting layer 14.

In one embodiment, the hetero-nucleation promoting layer 14 overlaying the impurity diffusion-resistant layer 12 shows rough surface which provides multiple nucleation sites for the plurality of the silicon grains.

In an example, a crystalline silicon ingot A is fabricated using the seed 1 of the invention and according to a directional solidification process. The seed 1 of the invention used in the fabrication of the crystalline silicon ingot A is overlaid by the impurity diffusion-resistant layer 12 and the hetero-nucleation promoting layer 14. As a comparison, a crystalline silicon ingot B is fabricated using a conventional seed and according to the directional solidification process. The seed used in the fabrication of the crystalline silicon ingot has no overlay of an impurity diffusion-resistant layer and a hetero-nucleation promoting layer. The minority carrier lifetime mappings of the crystalline silicon ingot A and the crystalline silicon ingot B are obtained by a μ-PCD way. These minority carrier lifetime mappings prove that the crystalline silicon ingot A has a red zone of a thickness of 40 mm at the bottom thereof, and the crystalline silicon ingot B has a red zone of thickness of 50 mm at the bottom thereof. It is evident that the magnitude of improvement regarding the red zone of the crystalline silicon ingot using the seed 1 of the invention can reach 20%. The yellow zone of the crystalline silicon ingot A is smaller than that of the crystalline silicon ingot B. Obviously, the crystalline silicon ingot is fabricated using the seed 1 of the invention has effect of significantly lowering pollution at the bottom thereof and enhancing quality thereof.

In summary, it can be understood that the seed of the invention used in fabrication of the crystalline silicon ingot can effectively resist impurities in the silicon melt in diffusing into the seed and then back into the solidified silicon grains. Thereby, the seed of the invention can reduce the red zone of the crystalline silicon ingot fabricated using such seed.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A seed, comprising:
   a crystal, constituted by at least one grain;
   an impurity diffusion-resistant layer, formed to overlay an outer surface of the crystal; and
   a hetero-nucleation promoting layer, formed to overlay the impurity diffusion-resistant layer wherein the impurity diffusion-resistant layer is formed of one selected from the group consisting of BaO, tetraethyl orthosilicate (TEOS), silicon powders, BaCO$_3$/TEOS mixture, BaCO$_3$/SiO$_2$ mixture, SiN/TEOS mixture, SiN/SiO$_2$ mixture, BaO/SiN mixture, BaO/SiO$_2$ mixture, BaO/TEOS mixture, SiO$_2$, graphite, AlP, GaP and metal fluorides,
   and wherein the at least one grain is formed of one selected from the group consisting of Si, SiC, SiO$_2$, SiN and graphite.

2. The seed of claim 1, wherein the hetero-nucleation promoting layer is formed of SiN or BN.

* * * * *